(12) United States Patent
Singh et al.

(10) Patent No.: US 7,661,051 B2
(45) Date of Patent: Feb. 9, 2010

(54) SYSTEM TO REDUCE PROGRAMMABLE RANGE SPECIFICATIONS FOR A GIVEN TARGET ACCURACY IN CALIBRATED ELECTRONIC CIRCUITS

(75) Inventors: Gurjinder Singh, Gilroy, CA (US); Ara Bicakci, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 338 days.

(21) Appl. No.: 11/696,477

(22) Filed: Apr. 4, 2007

(65) Prior Publication Data

US 2008/0246515 A1  Oct. 9, 2008

(51) Int. Cl.
*G01R 31/28* (2006.01)

(52) U.S. Cl. .................. 714/734; 714/740; 714/47; 714/709; 714/721; 714/742; 714/745; 365/201; 326/30; 327/156; 327/158; 331/117 R; 702/107

(58) Field of Classification Search .................. None
See application file for complete search history.

(56) References Cited

U.S. PATENT DOCUMENTS

| | | | | |
|---|---|---|---|---|
| 5,142,496 A | * | 8/1992 | Van Buskirk | 365/201 |
| 6,703,885 B1 | * | 3/2004 | Fan et al. | 327/308 |
| 6,731,145 B1 | * | 5/2004 | Humphreys et al. | 327/156 |
| 6,885,958 B2 | * | 4/2005 | Yaklin | 702/107 |
| 6,980,020 B2 | * | 12/2005 | Best et al. | 326/30 |
| 7,046,179 B1 | * | 5/2006 | Taft et al. | 341/120 |
| 2002/0033741 A1 | * | 3/2002 | Craninckx et al. | 331/117 R |
| 2006/0087339 A1 | * | 4/2006 | Chung et al. | 326/30 |
| 2007/0096785 A1 | * | 5/2007 | Maeda | 327/158 |
| 2008/0048714 A1 | * | 2/2008 | Lee et al. | 326/30 |
| 2008/0061818 A1 | * | 3/2008 | Santurkar et al. | 326/30 |
| 2009/0091334 A1 | * | 4/2009 | Yuan | 324/601 |

* cited by examiner

*Primary Examiner*—John P Trimmings
(74) *Attorney, Agent, or Firm*—Christopher P. Maiorana, PC

(57) ABSTRACT

An apparatus comprising a comparator circuit, a reference circuit, a plurality of elements and a logic circuit. The comparator circuit may be configured to generate a difference signal in response to (i) a reference signal and (ii) a test signal. The reference circuit configured to generate the reference signal in response to a first control signal. The plurality of elements may each be configured to generate an intermediate test signal. One of the intermediate test signals may be presented as the test signal by activating one of the test elements, in response to a second control signal. The logic circuit may be configured to generate (i) the first control signal and (ii) the second control signal, each in response to the difference signal.

15 Claims, 3 Drawing Sheets

SYSTEM TO REDUCE PROGRAMMABLE RANGE SPECIFICATIONS FOR A GIVEN TARGET ACCURACY IN CALIBRATED ELECTRONIC CIRCUITS

FIELD OF THE INVENTION

The present invention relates to electronic circuits generally and, more particularly, to a system to reduce the programmable range specifications for a given target accuracy in calibrated electronic circuits.

BACKGROUND OF THE INVENTION

Due to manufacturing limitations in Integrated Circuits (ICs), elements vary in properties from each other even if such circuits are intended to be exactly the same. Such variations can be systematic and/or random. Mismatches between different elements often causes non-idealities in the circuits.

Conventional approaches to mitigate the problem of mismatch among different elements in electronic circuits implement various forms of calibration. Calibration is often performed against a fixed reference element. The more complexity in such calibration systems, the more chip area needed.

It would be desirable to implement a system that reduces the size and cost of calibrating an electronic component manufactured on an integrated circuit (IC).

SUMMARY OF THE INVENTION

The present invention concerns an apparatus comprising a comparator circuit, a reference circuit, a plurality of elements and a logic circuit. The comparator circuit may be configured to generate a difference signal in response to (i) a reference signal and (ii) a test signal. The reference circuit may be configured to generate the reference signal in response to a first control signal. The plurality of elements may each be configured to generate an intermediate test signal. One of the intermediate test signals may be presented as the test signal by activating one of the test elements, in response to a second control signal. The logic circuit may be configured to generate (i) the first control signal and (ii) the second control signal, each in response to the difference signal.

The objects, features and advantages of the present invention include providing a calibration system for a circuit that may (i) provide programmability in the reference element and/or (ii) provide a system that reduces the size and cost of calibration.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Calibration of an integrated circuit is often performed by comparing a value of a component against a known fixed value. Consider a current steering digital to analog converter (DAC) that may have 8 current elements. The 8 elements should ideally match a reference element. To achieve this goal, each current element is divided into two parts—a larger, fixed part and another smaller, programmable part. The programmability may be achieved by implementing small current elements within the main element. The small current elements are turned on/off to provide programmability to match the total current of each current element equal to the reference current element. The amount of current the programmable part carries depends on the degree of matching accuracy needed. The particular number of small current elements associated with each current element depends on the expected variation of the larger fixed part.

Due to manufacturing limitations, the reference and/or actual current elements may vary from a nominal value by a standard deviation $\sigma$. Adjusting current elements to match a reference element within a desired accuracy needs a specific amount of range in the programmable portion. The range is used to bring the elements within a certain value of the reference element. For example, to achieve a 99.7% confidence (e.g., accuracy in 99.7% of the samples) the programmability range for each of the DAC current elements should be about $+/-6\sigma$. This is due to the fact that while the reference element may be on the negative extreme of the variation (i.e., $-3\sigma$) one of the DAC current elements may be on the positive extreme of the variation (i.e., $+3\sigma$) or vice versa. By making the reference element programmable, the programmable range may be reduced to $+/-3\sigma$. In particular, if the reference element is programmed to avoid the positive and negative extreme situations, the programmable range needed in each of the other elements may be reduced.

Figure 1:
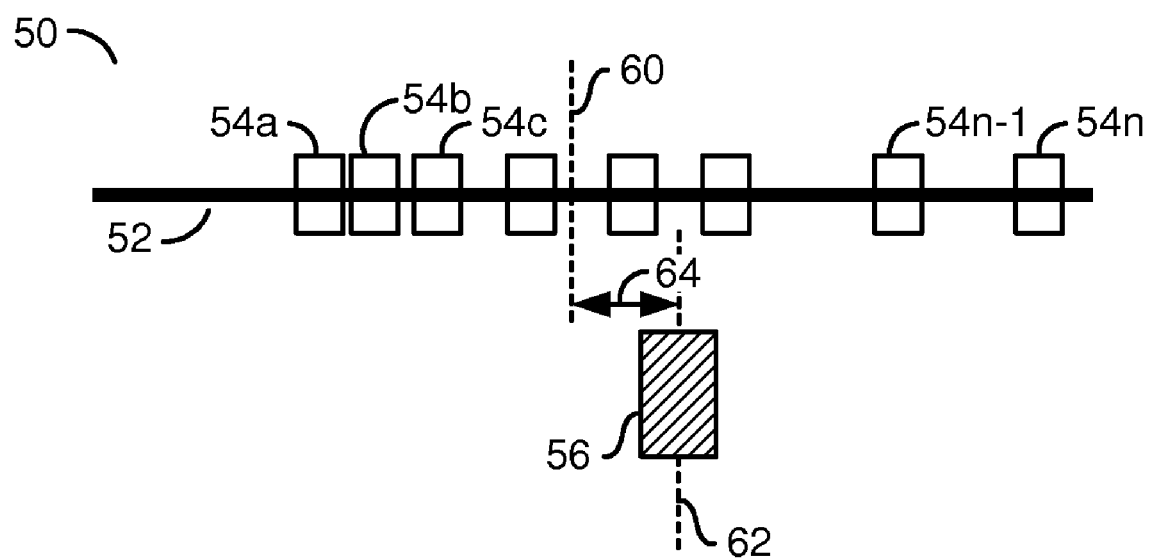
FIG. 1 is a diagram illustrating a context of the present invention.

Referring to FIG. 1, a circuit 50 is shown illustrating a context of the present invention. The circuit 50 shows an axis 52 having a number of elements 54a-54n, an element 56 and an axis 60. The element 56 may be implemented as a reference element. The elements 54a-54n may be elements manufactured in the fabrication process. In one example, the elements 54a-54n may be current elements. However, other elements may be implemented to meet the design criteria of a particular implementation. The elements 54a-54n normally have a fixed part (or portion) and a programmable part (or portion). The axis 60 marks an initial point of the reference element 56 that lies within a programmable range (e.g., through the programmable portions) of the elements 54a-54n. An axis 62 marks a target that also lies within a programmable range of the elements 54a-54n. An offset amount 64 normally compensates for the manufacturing variations (e.g., process, temperature, etc.). The offset 64 may be varied to meet the design criteria of a particular implementation. The axis 62 is approximately half way between the element 54a and the element 54n. The axis illustrates where the desired parameters for each of the elements 54a-54n may be brought to within a desired accuracy with the help of the programmable portions. In the case shown, the elements 54n-1 and 54n are offset more to the right of the axis 60 than the elements 54a-54b. To position the reference element 56 at the axis 62, the reference element 56 would be offset by the amount 64.

By adjusting the reference element 56, a programmability specification may be reduced to half the amount used with approaches that do not have such an adjustable reference element 56. By moving the reference element 56, the maximum amount each of the elements 54a-54n would need to be programmed may be reduced, by reducing the maximum amount the outermost elements 54a and 54n may need to be adjusted. The present invention may be used to calibrate the reference element 56. Similar to the elements 54a-54n, the reference element 56 comprises a fixed part (or portion) and a programmable part (or portion). The fixed portions may be a large part of the desired value, while the programmable portions may be a smaller part of the desired value. In order to achieve a target coverage level (e.g., 99.7%, although any desired target may be used), the programmable part of the reference current 56 may have a range of +/−3σ, where σ is the standard deviation of the fixed part compared with a nominal value. The reference element 56 may be adjusted so that the value of the reference element 54 is within a target range of the soon to be calibrated elements 54a-54n. By first calibrating the reference element 56, the elements 54a-54n may be calibrated to a common value using less variation than calibrating the elements 54a-54n to an arbitrary value.

Figure 2:
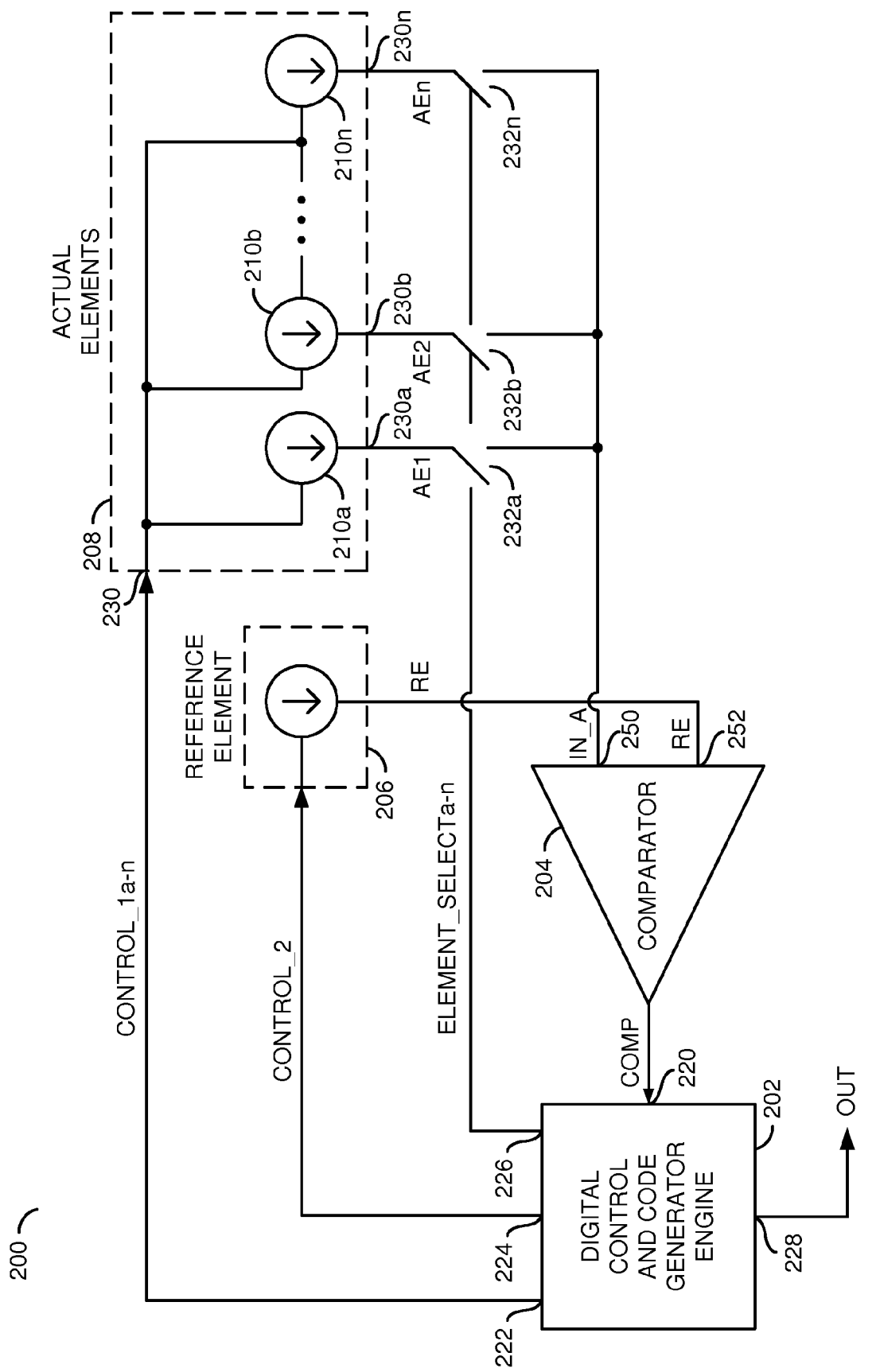
FIG. 2 is a block diagram of an implementation of the present invention.

Referring to FIG. 2, a diagram of a circuit 200 is shown implementing an embodiment of the present invention. The circuit 200 generally comprises a block (or circuit) 202, a block (or circuit) 204, a block (or circuit) 206, and a block (or circuit) 208. The circuit 202 may be implemented as a digital control and code generator engine circuit. The circuit 204 may be implemented as a comparator circuit. The circuit 206 may be implemented as a reference element. The circuit 208 may be implemented as a plurality of elements 210a-210n.

The circuit 202 may have an input 220 that may receive a signal (e.g., COMP), an output 222 that may present a signal (e.g., CONTROL_1a-n), an output 224 that may present a signal (e.g., CONTROL_2), an output 226 that may present a signal (e.g., ELEMENT_SELECTa-n), and an output 228 that may present a signal (e.g., OUT). The signal ELEMENT_SELECTa-n may be a multi-bit signal. The signal CONTROL_1a-n may be presented to an input 230 of the circuit 208. The signal CONTROL_1a-n may be a multi-bit signal, with each bit being configured to control (or adjust) a respective one of the elements 210a-210n. The signal CONTROL_2 may be a control signal used to adjust (or calibrate) the reference current element 206. The circuit 208 may have a number of outputs 230a-230n that may present the number of signals (e.g., AE1, AE2, . . . AEn).

The signals AE1-AEn normally represent a value (or parameter) being tested. For example, if the elements 210a-210n are implemented as current elements, the signals AE1-AEn may represent current. If the elements 210a-210n are implemented as resistive elements, the signals AE1-AEn may represent resistance values. A number of switches 232a-232n may be used to select which of the elements 210a-210n are connected (or active). The switches 232a-232n normally activate one of the elements 210a-210n at a time in response to one of the bits of the signal ELEMENT_SELECTa-n. Through the signal ELEMENT_SELECTa-n, each of the elements 210a-210n may be individually tested and/or calibrated. For example, the element 210a may be tested and calibrated first, then the element 210b, then the element 210c, etc.

The comparator 204 may have an input 250 that may receive a signal (e.g., IN_A). The signal IN_A may be generated in response to the selected elements 210a-210n. The reference current element 206 presents a signal (e.g., RE) that may be presented to an input 252 of the comparator circuit 204. The comparator 204 may generate the signal COMP in response to the signals IN_A and RE. In general, the signal COMP represents the difference between the signal IN_A and the signal RE. While the comparator 204 may normally measure a difference in current, the comparator 204 may be configured to measure voltages. For example, optional resistors may be added to the inputs 250 and 252.

The circuit 200 may use the comparator 204 and the digital engine 202 to compare characteristics of the reference element 206 with characteristics of the elements 210a-210n. The circuit 202 may generate an error code on the signal OUT. For example, the current elements 210a-210n may each have a five bit control for a respective programmable portion, where the higher bits corresponds to higher current and nominally, the most significant bit is one, and all other bits are zero. In such an example, an error code on the signal OUT may be generated to represent the difference (or distance) between the selected actual element 210a-210n and the current value of the reference element 206.

In the example mentioned above, the error code may vary from −16 to +15. If the tested parameter of the reference element 206 is less than the tested nominal value of particular current element 210a-210n under consideration, then the error code generated will be negative. If the tested parameter of the reference element 206 is greater than the tested nominal value of the particular element 210a-210n under consideration, then the error code generated will be positive. Such an error code may be generated for each of the elements 210a-210n on an individual basis. The control code may be adjusted such that the tested value of the selected current element 210a-210n is at a minimum value. If such a minimum value is larger then the present value of reference element 206, the control code generated will normally be −16. Otherwise, the control code may be adjusted so that the value of the selected element 210a-210n is gradually increased. The control code may become, at most, equal to or greater than the present value of reference element 206. The error code may be generated by finding the control code where such a transition occurs. Alternately, if the maximum possible value of the selected current element 210a-210n is less then the present value of reference element 206, the error code generated will be +15.

The individual error codes may each be presented on the signal OUT. In one example, the error codes may be presented in a serial arrangement (e.g., sequentially) on the signal OUT. In another example, the error codes may be presented as individual bits (e.g., in parallel) in a multi-bit signal OUT. A multiplexed signal OUT may also be implemented.

While the signal OUT is shown as a signal generated by the circuit 202, in one example, the signal OUT may be an internal signal used to guide the signal CONTROL_1a-n and the signal CONTROL_2. The generated error codes will store the information about the relative value of each of the elements 210a-210n nominal value compared to each of the possible values of the reference element 206. Using these error codes and a mathematical process of choice (e.g., averaging, median value, central value, etc.), the reference element 206 may be programmed optimally by modifying the programmable portion.

Figure 3:
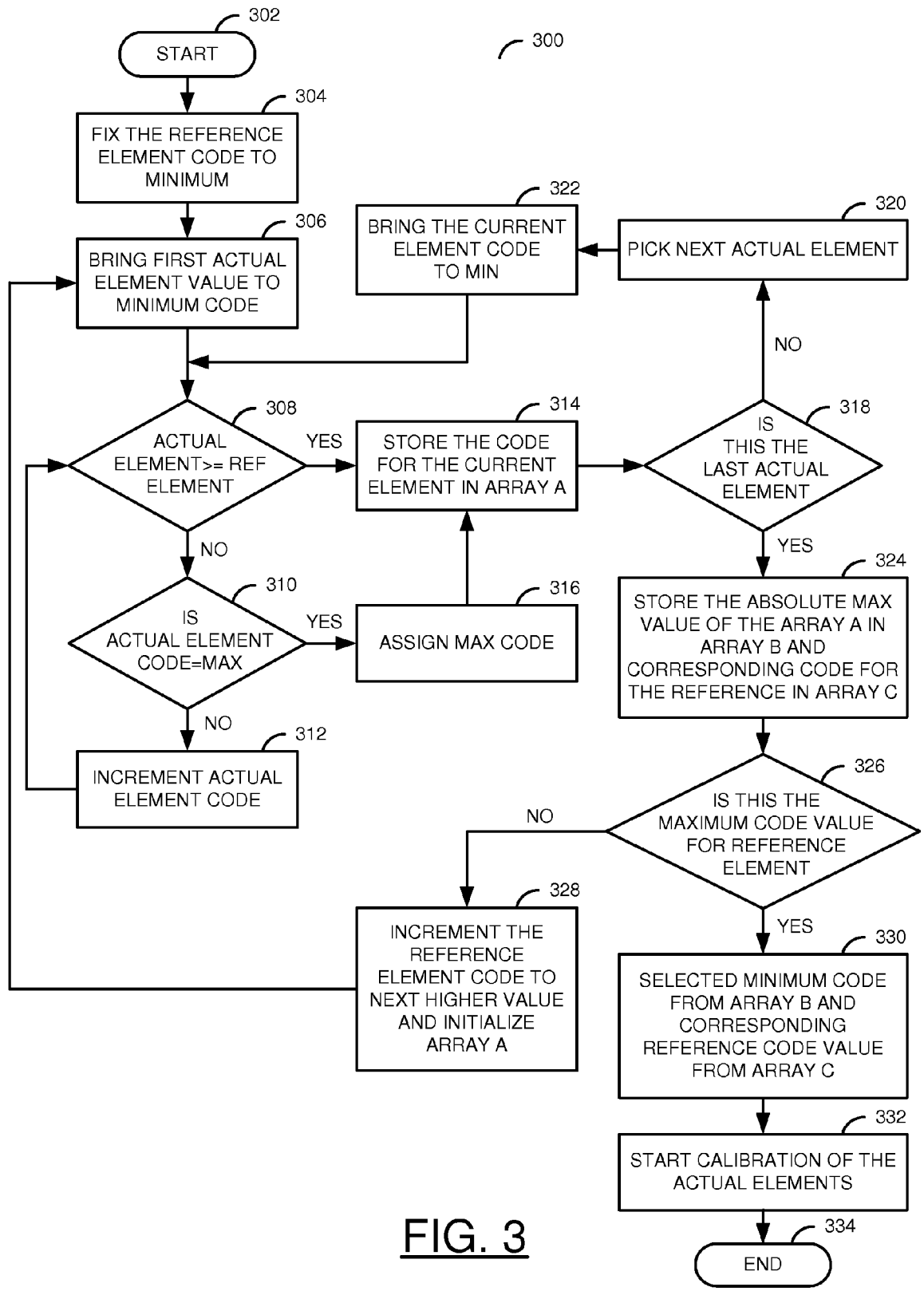
FIG. 3 is a flow chart illustrating the operation of the present invention.

Referring to FIG. 3, a method 300 illustrating an example operation of the present invention is shown. The method (or process) 300 may be referred to as a pre-calibration operation. The method 300 generally comprises a step (or block) 302, a step (or block) 304, a step (or block) 306, a step (or block) 308, a step (or block) 310, a step (or block) 312, a step (or block) 314, a step (or block) 316, a step (or block) 318, a step (or block) 320, a step (or block) 322, a step (or block) 324, a step (or block) 326, a step (or block) 328, a step (or block) 330, a step (or block) 332, and a step (or block) 334.

The method 300 generally searches for a worst separation value between the reference element 206 and the individual elements 210a-210n as the reference element 206 varies from a minimum possible value to a maximum possible value. At each particular reference value generated by the reference element 206, an error code is generated for each of the elements 210a-210n. The error codes signify the differences between the nominal values generated by each of the elements 210a-210n and the particular reference value generated by the reference element 206. The error codes may be obtained by finding the programmable codes at which the values of the elements 210a-210n cross (if at all) the particular reference value. At each of the particular reference values, a maximum error code and the corresponding programming code for the reference element 206 may be stored. The above process is generally repeated for all of the programmable codes of the reference element 206 (e.g., all of the particular reference values). From the resulting set of maximum error codes, a programming code for reference element 206 may be selected that corresponds to the minimum error code stored in the set. The selected programming code generally adjusts the reference element 206 such that the maximum adjustment distance from any given one of the elements 210a-210n to the reference element 206 is minimized.

A start step 302 begins the method 300. In the step 304, the reference code of the reference element 206 may be set to a minimum value by the circuit 202. As such, the reference element 206 may generate a minimum reference value (e.g., minimum reference current in the signal RE). The circuit 202 may set the programming code of an actual element being tested (e.g., first element 210a) among the elements 210a-210n to a minimum code value in the step 306. Therefore, the actual element under test may generate a minimum value (e.g., a minimum current in the signal AE1).

At the decision step 308, the comparator 204 generally determines if the actual value generated by the actual element under test (e.g., switched into the signal IN_A) is greater than or equal to the reference value generated by the reference element 206 (e.g., the signal RE). A result of the comparison may be presented to the circuit 202 in the signal COMP. If the signal COMP indicates that the actual value is less than the reference value (e.g., the NO branch of decision block 308), the circuit 202 may check to see if the programming code of the actual element under test is at a maximum in the decision block 310. If the programming code of the actual element under test is not at the maximum value (e.g., the NO branch of decision block 310), the circuit 202 generally increments the programming code of the actual element under test in the step 312. Adjustment of the programming code may be done in a linear search manner (e.g., from lowest to highest in uniform steps) or in a binary search manner.

The method 300 may continue with the step 306 presenting the incremented programming value to the actual element. Decision block 308, decision block 310 and step 312 may be repeated until either (i) the actual value generated by the actual element under test matches or exceeds the reference value or (ii) the programming code generated from the actual element under test reaches the maximum code value.

If and when the actual value matches or exceeds the reference value (e.g., the YES branch of decision block 308), the circuit 202 may store the current programming code of the actual element in an array (e.g., array 'A'). If the actual value generated by the actual element under test receiving the maximum programming code is still less than the reference value (e.g., the YES branch of decision block 310), the circuit 202 may assign the maximum programming code to the actual element under test in the step 316 and store the maximum programming code in the array in the step 314.

In the decision block 318, the circuit 202 may check if all of the elements 210a-210n have been examined. If the actual element under test is not the last element (e.g., the NO branch of decision block 318), the circuit 202 may set the next element (e.g., second element 210b) among the elements 210a-210n as the actual element under test in the step 320. In the step 322, the programming code for the new actual element under test may be set to a minimum value by the circuit 202. Thereafter, the steps 308-318 may be repeated for the new actual element under test. Once step 314 is reached, either (i) the programming code at which the actual value (e.g., current in the signal AE2) matched or exceeded the reference value or (ii) the maximum programming value may be stored in the array 'A'.

The method 300 may continue testing each successive element 210a-210n against the reference element 206 until all of the elements 210a-210n have been considered against the particular reference value in the signal RE (e.g., the YES branch of decision block 318). The circuit 202 may then search the array 'A' for a maximum error (e.g., a maximum programming code) for the elements 210a-210n in the step 324. The maximum error value found in the array 'A' may be stored (e.g., in an array 'B') and the corresponding code (e.g., particular programming code of the reference element 206) may be stored (e.g., in an array 'C') by the end of the step 324.

In a step 326, the circuit 202 may check the reference code of the reference element 206 against a maximum code value. If the current reference code does not match the maximum code value (e.g., the NO branch of decision block 326), the testing may continue at a next-higher reference code. In the step 328, the circuit 202 may increment the reference code value to a next-higher value and initialize the array 'A'. Thereafter, the first element among the elements 210a-210n may be programmed to the minimum value in the step 306.

The method 300 generally tests each of the elements 210a-210n against the reference element 206 at each of the reference codes. The errors may be stored the array 'A', the maximum errors may be stored in the array 'B' and the corresponding reference codes may be stored in the array 'C'. Once the last actual element (e.g., element 210n) has been tested at the highest reference code (e.g., the YES branch of decision block 326), the circuit 202 may examine the absolute maximum values within the array 'B'. The circuit 202 may select a particular absolute value in the array 'B' having the smallest value (e.g., smallest programming code) and the corresponding reference code in the array 'C' in the step 330. In the next step 332, the reference element 206 may be programmed to the reference code selected from the array 'C' and the actual elements 210a-210n may be adjusted (calibrated) to align within a specified resolution to the already adjusted reference element 206.

By using the pre-calibration steps 302-330, in which the reference value generated by the reference element 206 is changed, the reference value (e.g., signal RE) created by the reference element 206 may be brought within a $+/-3\sigma$ range of the variation of the other values (e.g., signals AE1-AEn) generated by the elements 210a-210n. The adjustment of the reference value generally reduces a burden on the programmable parts of the elements 210a-210n from $+/-6\sigma$ down to $+/-3\sigma$. The method 300 generally completes at an end step 334.

The present invention provides a target accuracy, while reducing the amount of programmable range of the calibrating elements, which saves chip area. Adding programmability to the reference element 206 adds little area overhead compared to the savings obtained in the programmable portion of the actual elements 210a-210n. In general, the number of actual elements 210a-210n is larger than the single reference element 206. In one example, A may be needed to implement the programmable portion of one element. If N denotes the total number of elements, the total area saving may be A/2*(N−1).

The present invention may be particularly useful in schemes where calibration does not run in the background or schemes which run only once at the time of startup. In such schemes, the reference element 206 may be eliminated, which may further save chip area. In such a case the area saved may be A/2*N. The present invention may be useful as a calibration scheme that may be employed in different types of elements.

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a comparator circuit configured to generate a difference signal in response to (i) a reference signal and (ii) a test signal;
    a reference circuit configured to generate said reference signal in response to a first control signal;
    a plurality of elements each configured to generate an intermediate test signal, wherein one of said intermediate test signals is presented as said test signal by activating one of said elements, in response to a second control signal; and
    a logic circuit configured to generate (i) said first control signal and (ii) said second control signal, each in response to said difference signal, wherein (A) said plurality of elements are sequentially tested until each of said plurality of elements have been tested, (B) said comparator circuit generates an individual difference signal for each of said plurality of elements, (C) said logic circuit generates an output signal in response to each of said individual difference signals, (D) said output signal comprises an average of said individual difference signals, and (E) said output signal comprises an error signal.

2. The apparatus according to claim 1, wherein said second control signal comprises a multi-bit control signal, wherein each bit of said multi-bit control signal is configured to enable one of said elements.

3. The apparatus according to claim 1, wherein said individual difference signals each comprise a manufacturing parameter being tested by said apparatus.

4. The apparatus according to claim 1, wherein said reference signal is adjusted in response to said output signal.

5. The apparatus according to claim 1, wherein said elements each comprise current elements used to implement a portion of an integrated circuit.

6. The apparatus according to claim 1, wherein each of said plurality of elements has (i) a fixed portion and (ii) a programmable portion, wherein said programmable portion is adjustable in response to said second control signal.

7. An apparatus comprising:
    means for generating a difference signal in response to (i) a reference signal and (ii) a test signal;
    means for generating said reference signal in response to a first control signal;
    a plurality of elements each configured to generate an intermediate test signal, wherein one of said intermediate test signals is presented as said test signal by activating one of said elements, in response to a second control signal; and
    means for generating (i) said first control signal and (ii) said second control signal, each in response to said difference signal, wherein (i) said plurality of elements are sequentially tested until each of said plurality of elements have been tested, (ii) means for generating said difference signal generates an individual difference signal for each of said plurality of elements, (iii) means for generating said first and second control signals generates an output signal in response to each of said individual difference signals, (iv) said output signal comprises an average of said individual difference signals, and (v) said output signal comprises an error signal.

8. A method for calibrating elements in an integrated circuit comprising the steps of:
    (A) generating a difference signal in response to (i) a reference signal and (ii) a test signal;
    (B) generating said reference signal in response to a first control signal using a reference circuit;
    (C) generating an intermediate test signal using a plurality of elements, wherein one of said intermediate test signals is presented as said test signal by activating one of said elements, in response to a second control signal; and
    (D) generating (i) said first control signal and (ii) said second control signal, each in response to said difference signal, wherein (i) said plurality of elements are sequentially tested until each of said plurality of elements have been tested, (ii) step (A) generates an individual difference signal for each of said plurality of elements, (iii) step (C) generates an output signal in response to each of said individual difference signals, (iv) said output signal comprises an average of said individual difference signals, and (v) said output signal comprises an error signal.

9. The method according to claim 8, wherein said second control signal comprises a multi-bit control signal, wherein each bit of said multi-bit control signal is configured to enable one of said elements.

10. The method according to claim 8, wherein said plurality of elements are sequentially tested until each of said plurality of elements have been tested.

11. The method according to claim 10, wherein step (A) generates an individual difference signal for reach of said plurality of elements.

12. The method according to claim 11, wherein step (D) generates an output signal in response to each of said individual difference signals.

13. The method according to claim 12, wherein said output signal comprises an average of said individual difference signals.

14. The method according to claim 13, wherein said individual difference signals each comprise a manufacturing parameter being tested by said apparatus.

15. The method according to claim 14, wherein said reference signal is adjusted in response to said output signal.

* * * * *